United States Patent [19]

Pierce et al.

[11] Patent Number: 5,094,972

[45] Date of Patent: Mar. 10, 1992

[54] MEANS OF PLANARIZING INTEGRATED CIRCUITS WITH FULLY RECESSED ISOLATION DIELECTRIC

[75] Inventors: John M. Pierce, Palo Alto, Calif.; Sung T. Ahn, Nara, Japan

[73] Assignee: National Semiconductor Corp., Santa Clara, Calif.

[21] Appl. No.: 538,645

[22] Filed: Jun. 14, 1990

[51] Int. Cl.⁵ ............................. H01L 21/76
[52] U.S. Cl. .......................... 437/67; 437/228
[58] Field of Search ................... 437/67, 225, 228

[56] References Cited

U.S. PATENT DOCUMENTS

| | | | |
|---|---|---|---|
| 3,648,125 | 3/1972 | Peltzer et al. | 317/235 |
| 3,892,608 | 7/1975 | Kuhn | 437/67 |
| 4,506,435 | 3/1985 | Plisein et al. | 437/67 |
| 4,526,631 | 7/1985 | Silvestri et al. | 437/67 |
| 4,554,728 | 11/1985 | Shepard | 437/67 |
| 4,666,556 | 5/1987 | Fulton et al. | 437/67 |
| 4,671,851 | 6/1987 | Beyer et al. | 437/67 |
| 4,791,073 | 12/1988 | Nagy et al. | 437/67 |
| 4,799,990 | 1/1989 | Kerbaugh et al. | 437/67 |
| 4,842,675 | 6/1989 | Chapman et al. | 437/228 |
| 4,876,214 | 10/1989 | Yamaguchi et al. | 437/67 |
| 4,910,155 | 3/1990 | Cote et al. | 437/228 |
| 4,952,524 | 8/1990 | Lee et al. | 437/67 |

OTHER PUBLICATIONS

"A Variable-Size Shallow Trench Isolation (STI) Technology with Difused Sidewall Doping for Submicron CMOS", by B. Davari, C. Koburger, T. Furukawa, Y. Taur, W. Noble, A. Megdanis, J. Warnock, J. Mauer, in the Institute of Electrical & Electronic Engineers Publication No. CH2528-8/88/0-00-0092, Proceedings of the 1988 IEDM Conference held in San Francisco, pp. IEDM 88-92 to IEDM 88-95.

"A New Planarization Technique, Using a Combination of RIE and Chemical Mechanical Polich (CMP)", by B. Davari, C. Koburger, R. Schultz, J. Warnock, T. Furukawwa, M. Jost, W. Schwittek, M. Kerbaugh, J. Mauer.

Primary Examiner—Olik Chaudhuri
Assistant Examiner—G. Fourson
Attorney, Agent, or Firm—Irving S. Rappaport; William H. Murray; Frank M. Linguiti

[57] ABSTRACT

An integrated circuit device is fabricated upon a semiconductor wafer by first forming a stop layer upon the surface of the wafer. Holes are formed through the stop layer and wells are formed in the semiconductor material of the semiconductor wafer below the openings. A dielectric layer is formed over the the surface of the device substantially filling the wells and covering the stop layer. The dielectric layer is then planarized to substantially the level of the stop layer. A PAD oxide layer is provided between the stop layer and the surface of the semiconductor device. Conventional thin film oxidation of the wells and implants into the side walls of the wells are performed. An abrasive mechanical polisher is used to perform the planarization wherein the mechanical polisher is provided with the self-stopping feature when it encounters the stop layer.

9 Claims, 4 Drawing Sheets

MEANS OF PLANARIZING INTEGRATED CIRCUITS WITH FULLY RECESSED ISOLATION DIELECTRIC

BACKGROUND OF INVENTION

1. Field of Invention

This invention relates to providing isolation between transistors of semiconductor devices and in particular to a process for making semiconductor devices having such isolation wherein the semiconductor device is planarized.

2. Background of the Invention

Various ways have been proposed to electrically isolate a plurality of pockets of semiconductor material in which one or more circuit elements can be formed. For example, these pockets can be isolated by growing oxide in certain regions of the silicon wafer. This is called local oxidation. This local oxidation produces a nonplanar surface because when silicon oxide is grown on the surface of silicon the thickness of the oxide which grows is approximately twice the thickness of the silicon oxidized. If a silicon surface is not etched prior to oxidation, the so called semi-recessed oxide results. If the silicon surface is etched prior to oxidation, the so called fully-recessed isolation results. Both the semi-recessed and the fully-recessed oxides suffer from lateral encroachment or growth of the isolation region. This is called "birds beaks" and it tends to occur at the boundary between the oxide being grown and the silicon. It can occur due to an extension of the growing oxide underneath a mask due to lateral diffusion of the oxidizing species.

When the semi-recessed oxide grows to a level higher than the original silicon surface, a nonplanar surface results. The fully-recessed oxide is flush with the original surface in large areas, but there are local ridges or "birds heads" at the edges. These must be planarized to avoid ribbon formation. Semi-recessed isolation is usually used for MOS technologies, while a planarized fully-recessed technology is used for bipolar circuits.

Encroachment reduces the area available to build devices on a wafer. To avoid encroachment, isolation schemes have been suggested which involve etching shallow trenches into the silicon surface, depositing oxide by chemical vapor deposition over the surface of the wafer, and then planarizing the surface by an elaborate combination of photolithography and reactive-ion-etching.

Many other ways have also been proposed to provide electrical isolation between circuit elements. Among the ways proposed are biased PN junctions disclosed in U.S. Pat. No. 3,117,260, issued Noyce on Jan. 7, 1964; combinations of PN junctions and zones of intrinsic and extrinsic semiconductor materials as taught in the U.S. patent issued to Noyce on Sept. 22, 1964; dielectric isolation disclosed in U.S. Pat. No. 3,391,023, issued to Frescura on July 2, 1968; and mesa etching disclosed in U.S. Pat. No. 3,489,961, issued to Frescura Jan. 13, 1970. Tucker, et al., in application Ser. No. 845,822, filed July 29, 1969, discloses the use of selectively doped polycrystalline silicon to help isolate islands of single crystal silicon in which circuit elements can be formed.

After electrically isolated pockets of semiconductor material are prepared, active and passive circuit elements are formed within or on the pockets. Many of these circuit elements are typically formed using the planar diffusion techniques disclosed by Hoerni in U.S. Pat. Nos. 3,025,589 and 3,064,167. In the planar process, the regions of each semiconductor pocket into which circuit elements are diffused are controlled by forming a diffusion mass from an insulation layer formed on the surface of the semiconductor material. After the desired elements have been formed in the semiconductor material, a conductive lead pattern is formed on the insulation and used to interconnect selective active and passive circuit elements into the desired circuit. Additional passive circuit elements can also be formed on the insulation and interconnected into the circuit. Such a structure is disclosed in U.S. Pat. No. 2,981,877, issued to Noyce on Apr. 25, 1961. Another way to improve planarization and reduce encroachment with grown oxide techniques is to change materials in the masking layer and put a layer of polysilicon between the oxide and the nitride.

In the manufacture of integrated circuits, several problems arise. First, the area of the wafer required for the placement of the isolation regions between adjacent pockets of semiconductor material is a significant portion of the total wafer area. A large isolation area reduces the number of devices which can be placed in a wafer and thus lowers the packing density of the circuit elements formed in the wafer. Second, the leads formed on, and adherent to, the insulation on the wafer surface sometimes crack at steps in the insulation on the wafer surface. These steps are often quite steep. To eliminate cracks in the interconnect leads at steps in the insulation, J. S. Sa in U.S. Pat. No. 3,404,451, issued Oct. 8, 1968, disclosed removing portions of this insulation from the wafer surface during processing. It has also been proposed to slope the edges of the insulation at the contact window. Another approach is to etch grooves into the semiconductor wafer adjacent to those regions in which PN junctions are formed and thermally oxidizing the material exposed by the grooves.

Third, several of the isolation techniques result in significant capacitances being introduced into the integrated circuit. At low frequencies, these capacitances do not affect the operation of the circuit. However, at high frequences these capacitances can have a significant effect on circuit performance.

Shallow trench isolation technology using RIE, CVD oxide fill and planarization to realize lithography-limited, submicron device and isolation dimensions is taught in "A Variable-Size Shallow Trench Isolation (STI) Technology with Defused Sidewall Doping for Submicron CMOS" by B. Davari, IEEE publication number CH2528-8/88/0000-0092, proceedings 1988 IEDM Conference, San Francisco, Calif. In this method, in order to achieve planarization, the trenches are filled with CVD oxide after passivation of the sidewalls by a boron diffusion. A block resist is then patterned followed by a planarization resist coat. The CVO oxide and the resist are then etched back and the surface is planarized. However, in addition to requiring the etchback, this method requires an extra photomasking step to pattern the blocking resist layer. This is expensive and a source of defects. This is required because a single planarization resist coat does not provide good results in the presence of large high or low areas.

SUMMARY OF THE INVENTION

An integrated circuit device as fabricated upon a semiconductor wafer by first forming a stop layer upon the surface of the wafer. Holes are formed through the stop layer and wells are formed in the semiconductor material of the semiconductor wafer below the openings. A dielectric layer is formed over the the surface of the device substantially filling the wells and covering the stop layer. The dielectric layer is then planarized to substantially the level of the stop layer.

DETAILED DESCRIPTION OF THE INVENTION

Figure 1A:
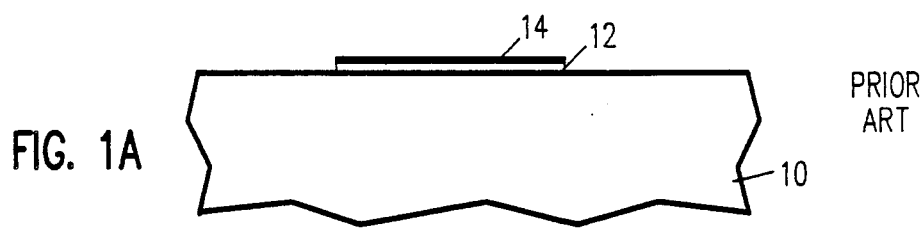
FIGS. 1A-L show cross-sectional representations of prior art methods for fabricating integrated circuit devices.
Figure 1B:
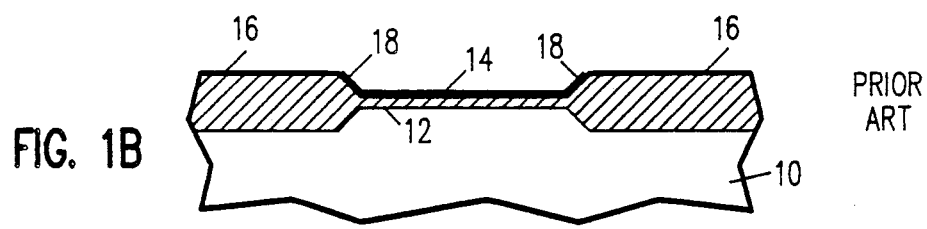
Figure 1C:
Figure 1D:
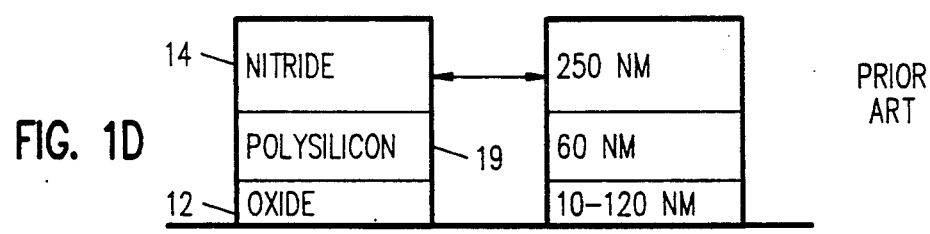
Figure 1E:
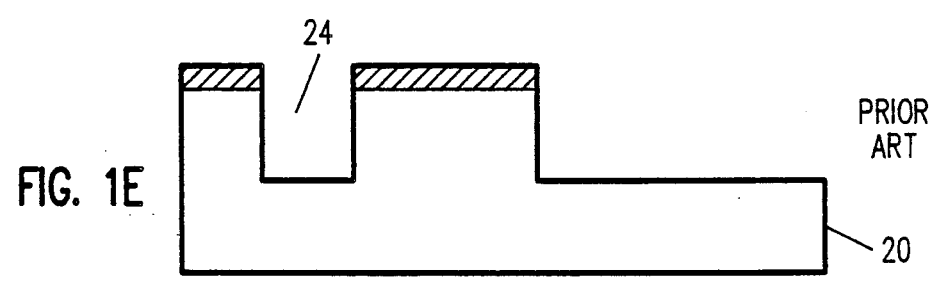
Figure 1F:
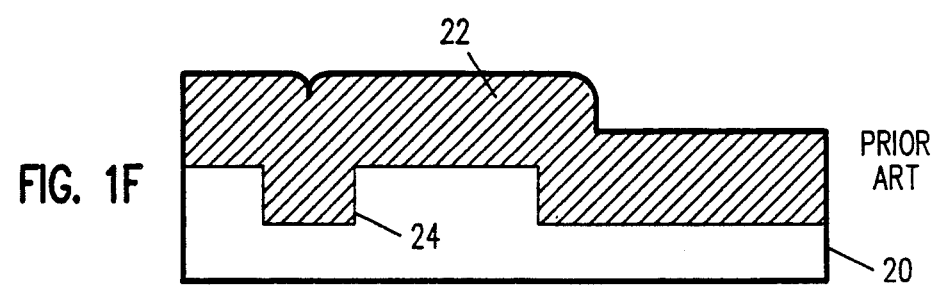
Figure 1G:
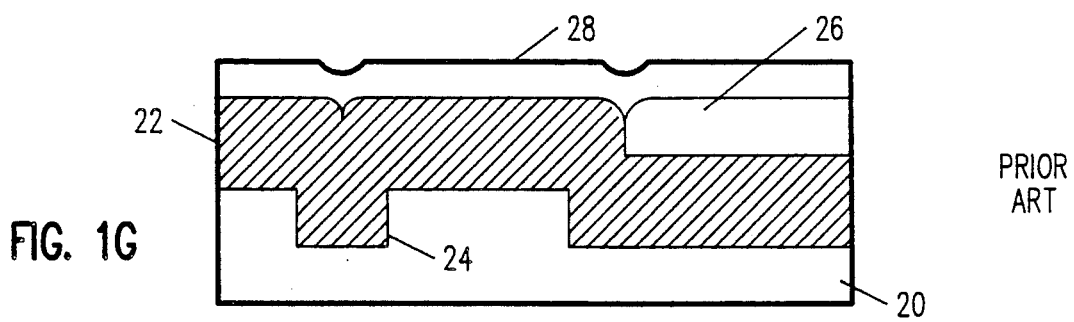
Figure 1H:
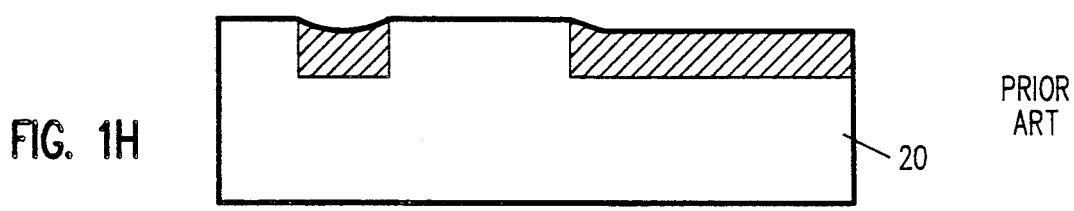
Figure 1I:
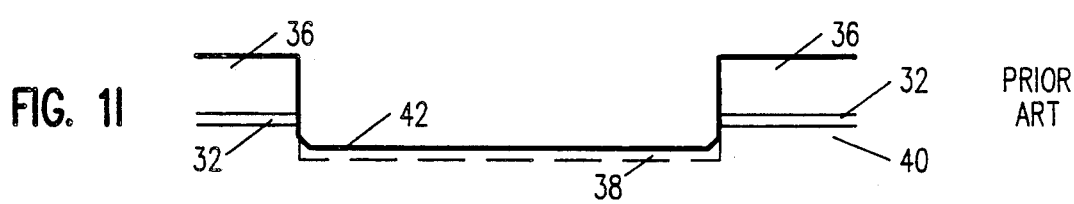
Figure 1J:
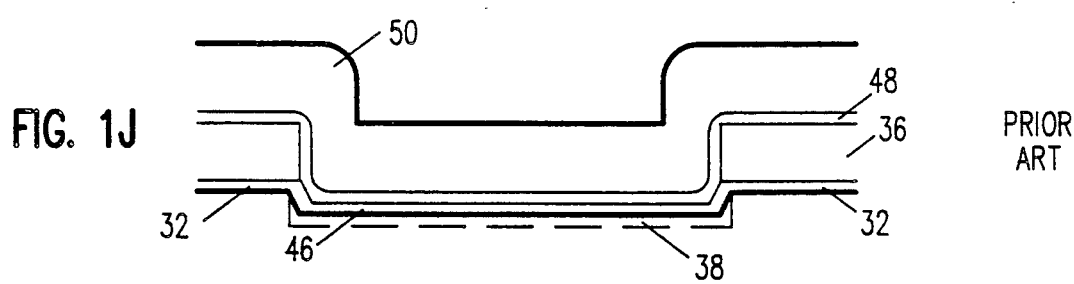
Figure 1K:
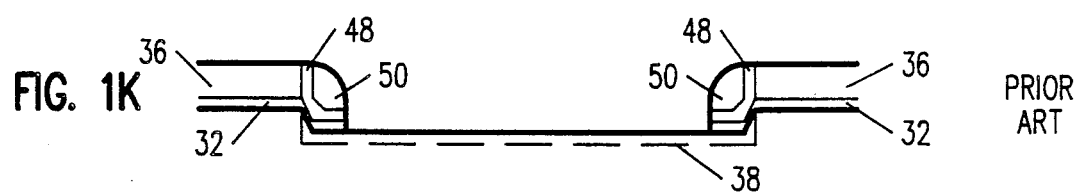
Figure 1L:
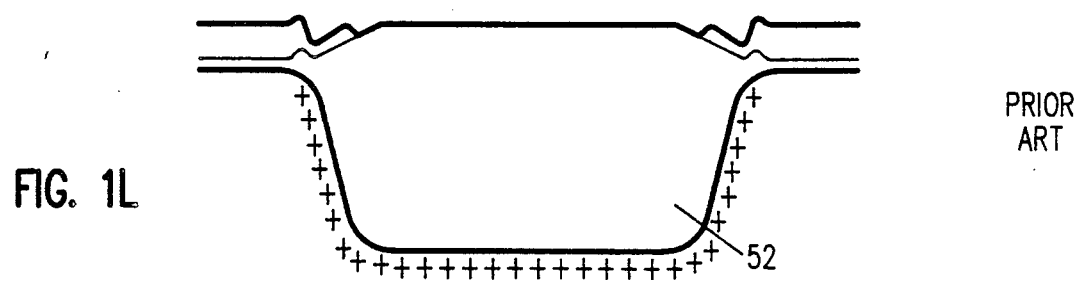

Referring now to FIGS. 1A-C, there is shown a representation of a prior art process for providing local oxidation or locos on the surface of semiconductor wafer 10. Silicon dioxide masking layer 12 is disposed over a portion of the surface of wafer 10. Silicon nitride layer 14 is disposed above silicon dioxide layer 12. Wafer 10 is exposed to oxidation, for example, by disposing wafer 10 in a furnace and providing an oxygen environment. The region of wafer 10 below silicon nitride layer 14 is protected from oxidation while oxide regions 16 are formed upon the surface of silicon wafer 10. Growing oxide layer 16 extends a small distance underneath the mask due to lateral diffusion of oxidizing species causing bird's beaks 18. Thus when masking layers 14, 12 are removed, oxide layers 16 encroach into the mask regions thereby causing the active area to be reduced. In addition, the integrated circuit is caused to be nonplanar. It is known to provide a polysilicon layer 19 between nitride layer 14 and oxygen layer 12 to decrease the amount of encroachment as shown in FIG. 1D.

Referring now to FIGS. 1E-H, there is shown an alternate prior art method wherein CVD oxide 22 is used to fill trench 24. CVD oxide layer 22 is not planar and photo resist layers 26, 28 are provided for the planarization process. To planarize a circuit using this method, block resist layer 26 is first applied and patterned using a photo masking step to fill large low areas of the circuit. Planarizing resist layer 28 is then applied to provide a planar top surface to the wafer. An etch back step is then used to planarize the CVD oxide layer 22.

Referring now to FIGS. 1I-L, there is shown a further alternate prior art method of performing local oxidation. LPCVD nitride layers 36 and first stress relief oxide layer 32 are disposed above wafer 40. After patterning of nitride layer 36, oxygen layer 32 and silicon wafer 40 are etched to provide well 42 in wafer 40. Boron implant 38 is performed to provide a boron channel stop at the bottom of well 42. Second stress relief oxide layer 46 is then formed at the bottom of well 42. LPCVD nitride layer 48 is formed over nitride layer 36 and oxide layer 46 and CVD oxide layer 50 is formed over nitride layer 48. Thus, the side walls of well 42 are covered by nitride. An anisotropic etch is performed to etch oxide layer 50, nitride layer 48 and oxide layer 46. CVD oxide layer 50 is then removed and field oxide 52 is formed. This method reduces birds heads but vestigial birds heads remain.

Figure 2:
FIGS. 2-8 show cross-sectional representations of the method of the present invention for fabricating integrated circuit devices.
Figure 3:
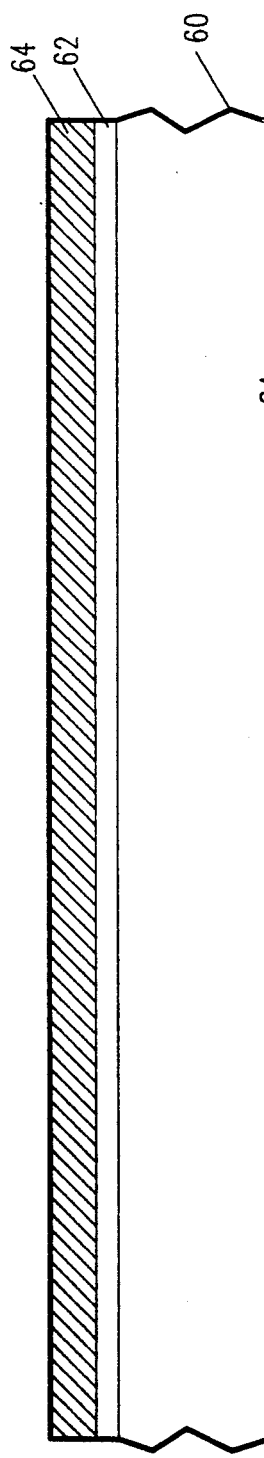

Referring now to FIGS. 2, 3 there are shown steps in the method of planarizing integrated circuits with fully recessed isolation dielectric of the present invention. Pad oxide layer 62 is disposed over the surface of silicon wafer 60. Pad oxide layer 62 may be any type of protective film for protecting the underlying silicon wafer 60 from damage. Stop layer 64 is disposed over pad oxide layer 62. The combination of pad oxide layer 62 and stop layer 64 resists oxidation of the surface of silicon wafer 60 and protects underlying silicon wafer 60 from damage due to polishing. Additionally, pad oxide layer 62 and stop layer 64 erode more slowly during the polishing process than silicon dioxide thereby providing a self-stopping feature to the method of the present invention.

Figure 4:
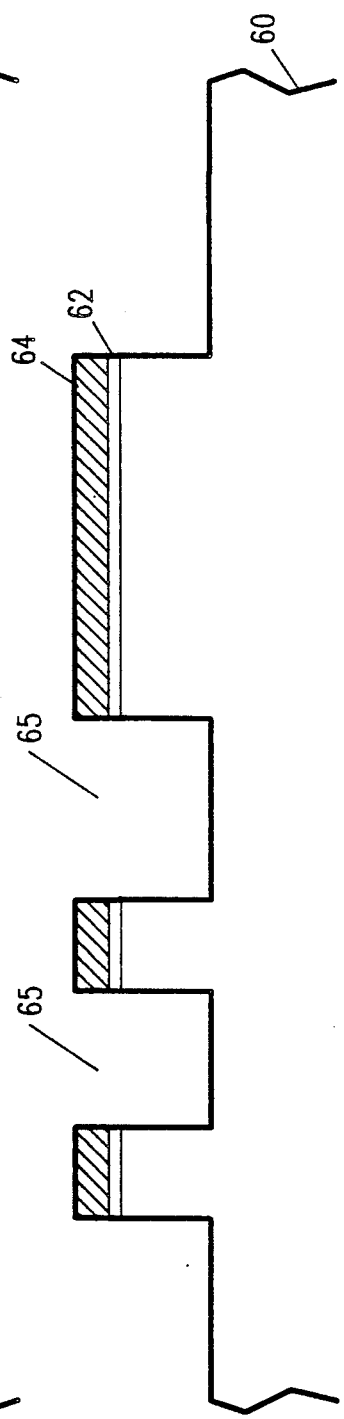
Figure 5:
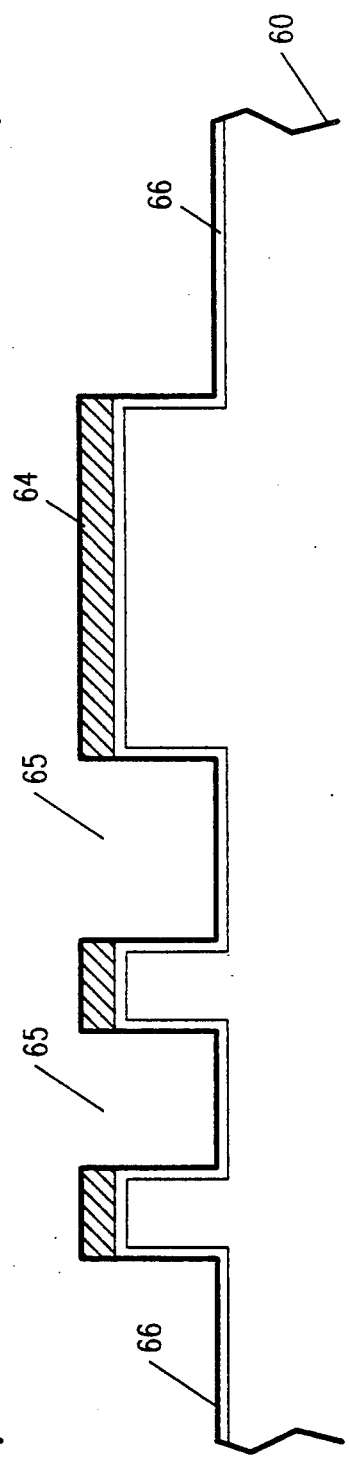

Referring now to FIGS. 4, 5, pad oxide layer 62 and stop layer 64 are etched as determined by a lithographic mask (not shown). Additionally, openings 65 are etched into the surface of silicon wafer 60 to the full depth required for isolation in the final process. A thin field oxidation is performed to grow thin oxide layer 66 over the exposed portions of silicon wafer 60 including the side walls and bottoms of openings 65 formed by the etch. Thin oxide layer 66 does not grow over stop layer 64 because stop layer 64 is selected to resist oxidation.

Figure 6:
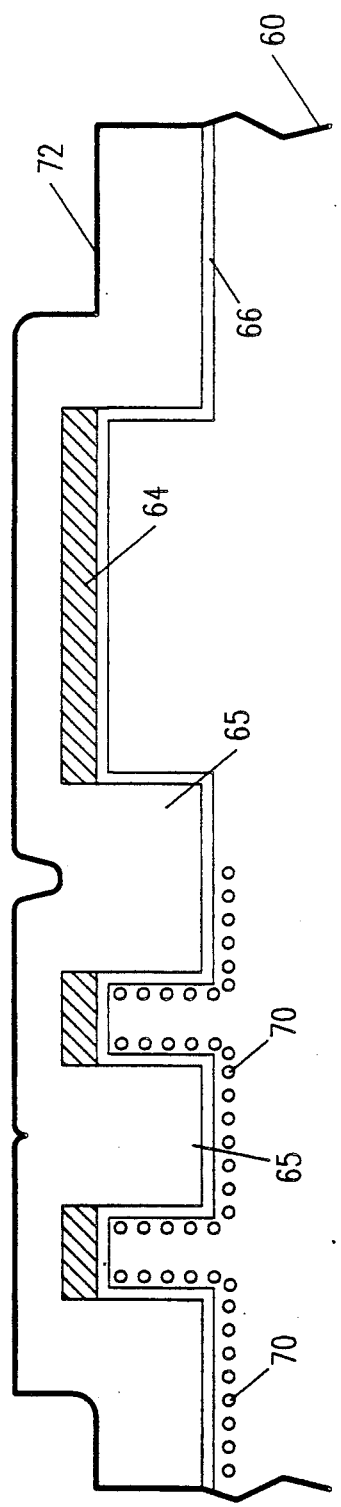

Referring now to FIG. 6, implants for doping the side walls and bottoms of openings 65 may be performed after thin oxide layer 66 is formed depending on the requirements of the integrated circuit being fabricated upon silicon wafer 60. Field implants 70 may be provided, for example, by tilting and rotating silicon wafer 60 to dope the side walls of openings 65. CVD isolation dielectric layer 72 is then deposited over the surface of silicon wafer 60. Isolation dielectric layer 72 may be silicon dioxide but may also be some other form of deposited dielectric and is optimized to be conformal in such a way that it fills openings 65 without producing voids.

Figure 7:
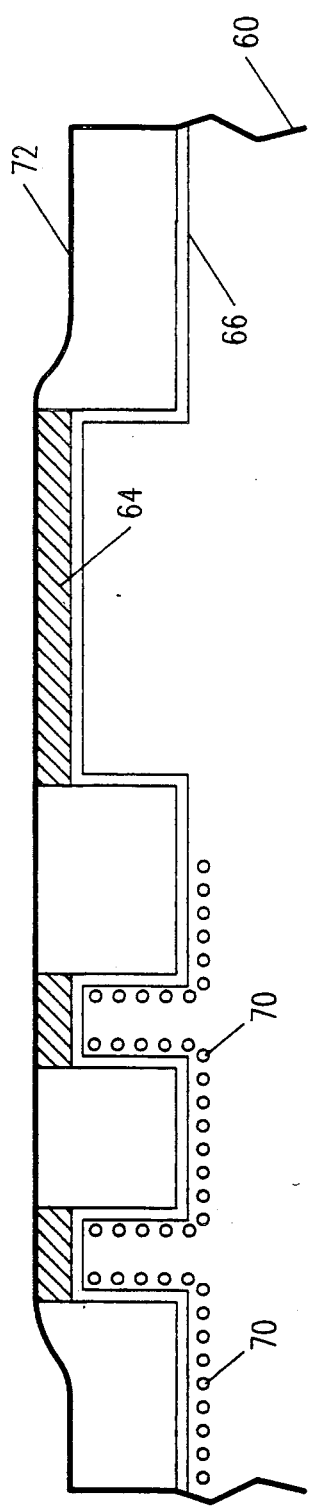
Figure 8:
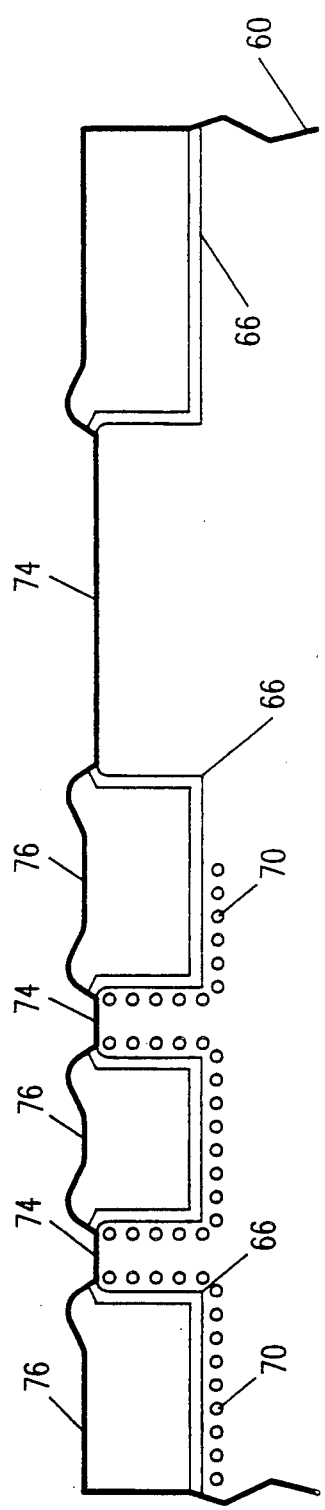

Referring now to FIG. 7, the surface of isolation dielectric layer 72 is then polished with a mechanical polisher (not shown) having a soft semirigid pad (not shown) saturated with a slurry of abrasive particles (not shown) such as colloidal silica (not shown) in an alkaline base and water. The saturated pad is rubbed on the surface of isolation dielectric layer 72 to perform chemical mechanical polishing and erode isolation dielectric layer 72.

Stop layer 64 is adapted to erode much more slowly than dielectric layer 72. Therefore when polishing gets to the level of stop layer 64 and exposes stop layer 64, polishing is slowed down due to the nature of the polishing process. Planarization of isolation dielectric layer 72 is thus provided with a self-stopping feature. This slowing of the polishing process by stop layer 64 also slows erosion of adjacent regions of isolation dielectric 72. This effect results from the mechanical stiffness of the polishing pad, and results in the effective planarization of dielectric regions up to one millimeter or more wide. The bridging effect of the semirigid polishing pad eliminates the need for two film depositions and an extra mask step in the prior art technology. Stop layer 62 is then stripped to expose underlying regions 74 of silicon wafer 60. Underlying regions 74 are then suitable for the formation of active elements (not shown) separated by isolated regions 72.

The abrasion of isolation dielectric layer 72 is mostly by mechanical means but partly by chemical means. As previously described, the material of stop layer 64 is chosen to be harder than dielectric layer 72 so that the erosion rate of stop layer 64 is significantly lower than that of dielectric layer 72. For example, dielectric layer 72 may be formed of CVD silicon dioxide and stop layer 64 may be formed of CVD silicon nitride or CVD carbon. Other materials providing the required properties may also be used.

When a region of stop layer 64 is exposed by the mechanical planarization process, the erosion rate of isolation dielectric layer 72 in regions surrounding the exposed region of stop layer 64 slows down significantly. Thus, the level of oxide layer 72 in the vicinity of a region of exposed stop layer 64 remains substantially even with the level of stop layer 64. Meanwhile, polishing continues elsewhere on the surface of the wafer where local regions of stop layer 64 are not yet exposed. Thus, the non-uniformities in isolation dielectric layer 72 are compensated and it is possible to remove all dielectric material of isolation dielectric layer 72 from above the regions of stop layer 64.

It will be understood that various changes in the details, materials and arrangements of the parts which have been described and illustrated in order to explain the nature of this invention, may be made by those skilled in the art without departing from the principal and scope of the invention as expressed in the following claims.

We claim:

1. A method of fabricating an integrated circuit device upon a semiconductor wafer, comprising the steps of:
    (a) forming a stop layer upon the surface of said semiconductor wafer,
    (b) forming openings of varying widths through said stop layer,
    (c) forming a plurality of isolation wells of varying widths including isolation wells which re relatively narrow and isolation wells which are relatively wide with respect to said relatively narrow isolation wells in said semiconductor wafer blow said openings,
    (d) forming a dielectric layer over the surface of said integrated circuit device including over said relatively wide isolation wells,
    (e) mechanical planarizing of said dielectric layer to substantially the level of said stop layer by means of a semirigid pad applied directly to said dielectric material over said relatively wide isolation wells, the rigidity of said semirigid pad being sufficient to bridge said relatively wide isolation wells to limit removal of said dielectric material from within said relatively wide isolation wells below the level of said stop layer, and
    (f) said openings of said relatively wide wells having a dimension substantially equal to one millimeter or more.

2. The method of claim 1, wherein step (a) is preceded by the step of forming a PAD oxide layer upon the surface of said semiconductor wafer.

3. The method of claim 1, wherein said stop layer comprises silicon nitride.

4. The method of claim 1, wherein step (c) is followed by the step of performing a thin field oxidation upon the exposed surfaces of said wells.

5. The method of claim 1, wherein step (c) is followed by the step of performing implants into the walls of said wells.

6. The method of claim 1, wherein step (d) comprises substantially covering said stop layer with said dielectric layer.

7. The method of claim 1, wherein step (e) comprises chemical mechanical polishing by means of mechanical polishing means.

8. The method of claim 7, wherein said polishing comprises self-stopping polishing for slowing said mechanical polishing means when said mechanical polishing means encounters said stop layer.

9. The method of claim 1, further comprising the step of removing said stop layer to expose active regions of said semiconductor wafer.

* * * * *